(12) United States Patent
Danov

(10) Patent No.: US 6,188,163 B1
(45) Date of Patent: Feb. 13, 2001

(54) CONVERTER WITH PIEZOCERAMIC TRANSFORMER

(75) Inventor: Guenrikh Danov, Moskboe (RU)

(73) Assignee: Dong Il Technology Ltd., Kyunggi-do (KR)

(*) Notice: Under 35 U.S.C. 154(b), the term of this patent shall be extended for 0 days.

(21) Appl. No.: 09/297,270

(22) PCT Filed: Oct. 29, 1996

(86) PCT No.: PCT/KR96/00185

§ 371 Date: Apr. 28, 1999

§ 102(e) Date: Apr. 28, 1999

(87) PCT Pub. No.: WO98/19348

PCT Pub. Date: May 7, 1998

(51) Int. Cl.⁷ .................................................. H01L 41/08
(52) U.S. Cl. .......................... 310/366; 310/359; 310/316
(58) Field of Search .................................. 310/316, 317, 310/319, 366, 358, 359

(56) References Cited

U.S. PATENT DOCUMENTS

| 2,976,501 | * | 3/1961 | Mattiat | 310/359 X |
| 3,736,446 | | 5/1973 | Berlincourt et al. | 310/359 |
| 3,764,848 | * | 10/1973 | Berlincourt | 310/359 X |
| 5,118,982 | | 6/1992 | Inoue et al. | 310/359 |
| 5,241,236 | | 8/1993 | Sasaki et al. | 310/359 |
| 5,329,200 | * | 7/1994 | Zaitsu | 310/366 X |
| 5,341,061 | * | 8/1994 | Zaitsu | 310/366 X |
| 5,371,430 | * | 12/1994 | Sato et al. | 310/359 |
| 5,440,195 | | 8/1995 | Ohnishi et al. | 310/359 |
| 5,705,879 | * | 1/1998 | Abe et al. | 310/359 |
| 5,751,092 | * | 5/1998 | Abe | 310/359 |
| 5,777,425 | * | 7/1998 | Ino et al. | 310/359 |
| 5,962,953 | * | 10/1999 | Sasaki et al. | 310/359 |

FOREIGN PATENT DOCUMENTS

| 294379A5 | | 9/1991 | (DE) . | |
| 148361A1 | | 7/1985 | (EP) . | |
| 605901A1 | | 7/1994 | (EP) . | |
| 404-467-504 | * | 6/1992 | (JP) | 310/359 |
| 08069890 | * | 3/1996 | (JP) | 310/359 |

* cited by examiner

*Primary Examiner*—Mark O. Budd
(74) *Attorney, Agent, or Firm*—Jacobson, Price, Holman & Stern, PLLC

(57) ABSTRACT

A piezoceramic converter for high power applications is built with a piezoceramic transformer and a pulse-synchronized electronic feedback circuit. The piezoceramic transformer is designed in the form of a square or circular piezo plate, polarized in thickness direction and excited in contour extensional mode in order to handle high power. A pulse-synchronized electronic feedback circuit is incorporated to stabilize output voltage and current under varying loading conditions. Frequency programming elements, a resistor and a capacitor are built into the control circuit to set an operating frequency of the piezoceramic transformer.

10 Claims, 4 Drawing Sheets

OUTPUT VOLTAGE AS A FUNCTION OF FIELD INTENSITY – NO LOAD

OUTPUT VOLTAGE AS A FUNCTION OF FIELD INTENSITY – R = 1k Ω

CONVERTER WITH PIEZOCERAMIC TRANSFORMER

TECHNICAL FILED

This invention relates to a converter with piezoceramic transformer.

BACKGROUND ART

Solid state piezoceramic converter with a small output power around 3 watts has been developed and applied as a power source for LCD backlight in notebook computer.

Following references may be referred to understand prior art in this field.

1. C. A. Rosen, "Ceramic transformers and filters", Proc. Electronic Comp. Symp., 1956.
2. H. W. Katz, "Solid state magnetic and dielectric devices", New York: John Wiley and Sons. 1959.
3. W. P. Mason, "Physical acoustics", Vol.1 Part A.1964.
4. R. Holland, "Contour extensional resonant properties of rectangular piezoelectric plates", IEEE Trans., Sonics and Ultrasonics, SU-15. pp. 97–105, April, 1968.
5. A. A. Yerofeev, A. I. Proklin, V. I. Orekhov, et al. "Piezoelectric current transformer", USSR Inventor Certificate No. 1254967, published 1986, Bull. No.32 (in Russian).

However, piezoceramic transformer(PCT) for a large power application was not very successful due to a lack of adequate design of piezoceramic element which can deliver a large output current.

This invention is to design converters using PCT which can directly input household electricity, 220 V (110 V) 50 Hz or 60 Hz at an output power up to several dozens watts for applications such as electric illumination appliances, medical appliances, etc.

Piezoelectric transformer as an electromechanical electric energy transformer has monolithic solid state constructions made of piezoceramic in a form of bar, plate, disk, or cylinder. The unique feature of PCT is the resonance nature of electric energy transfer within a relatively narrow frequency band near the mechanical resonance, where the amplitude of mechanical internal stress achieves the maximum value (1, 2, 3).

While electric energy transfer in traditional electromagnetic (coiled) transformers is realized through electromagnetic-coupling from the input to the output, energy transfer in a PCT is achieved through electro-mechanical coupling. Unlike a low-impedance electromagnetic transformer, PCT is rather a power source due to a relatively high output impedance.

Piezoceramic transformers have the following major advantages:
  enhanced efficiency and a low level of electromagnetic interference
  planar construction and highly selective frequency characteristics
  simple monolitic construction for ease of mass production
  high operating frequency of electric energy transformation
  no fire hazard and enhanced safety to shorting According to the type of deformation wave excited in the bulk of dielectric (piezoelectric) element, PCTs are classified into longitudinally-transverse and bending. The most common PCT are of plate and bar type with excitation of longitudinal oscillations oriented along width, length, or circumference. (4, 5).

Selection of PCT construction and thus its working frequency is determined primarily by the technical requirements to the input and output parameters such as input/output voltage, load resistance, load current, the stability of the output voltage and the admissible driving frequency.

DISCLOSURE OF INVENTION

The object of this invention is to design a compact, reliable and economic converter using a piezoceramic transformer which can handle household electricity, 110/220V AC with 50/60 Hz directly and a large power up to 40 W.

In order to achieve the aforementioned object, this invention provides a piezoceramic converter for high power applications which is constructed with a piezoceramic transformer being designed in the form of a square or circular piezoplate polarized in thickness direction and excited in contour extensional mode mode. The size of the piezoceramic transformer is 10–50 mm in side of square plate or in diameter of circular plate and 1–6 mm in thickness. A pulse-synchronized electronic feedback circuit is incorporated to stabilize output voltage and current under varying load conditions. Feedback circuit consists of two diodes and a capacitor connected in parallel and a resistor connected in series to it. Frequency programming elements, a resistor and a capacitor are built into the control circuit to set an operating frequency of the piezoceramic transformer.

BRIEF DESCRIPTION OF DRAWINGS

These and other objects as well as advantages of the present invention will become clear by the following description of the best mode for carrying out the invention with reference to the accompanying drawings, wherein.

BEST MODE FOR CARRYING OUT THE INVENTION

The object of the invention is achieved with a PCT in the form of a square or circular piezoplate polarized in thickness direction and excited in contour extensional oscillation mode which has a high electromechanical coupling coefficient and monochromatic amplitude-frequency characteristic of the output voltage and with a pulse synchronized positive feedback circuit. This provides unambiguous phase characteristics in the voltage of positive feedback and a stable operation of the electronic transformer at the resonance frequency of PCT even with great changes in the loading current. Therefore, the working efficiency and reliability of PCT are increased drastically.

The suggested piezoceramic converter contains a driving circuit loaded with voltage developed by the positive feedback current from the output of the PCT. The piezotransformer is designed in the form of a square or circular piezoceramic plate polarized in thickness direction working in contour extensional mode, where the input excitation section is arranged in the center and the output generator section in the remaining part of the piezoplate near to perimeter or vice versa. The characteristic size of the inner electrode is 10–80% of the square piezoplate.

Figure 1:
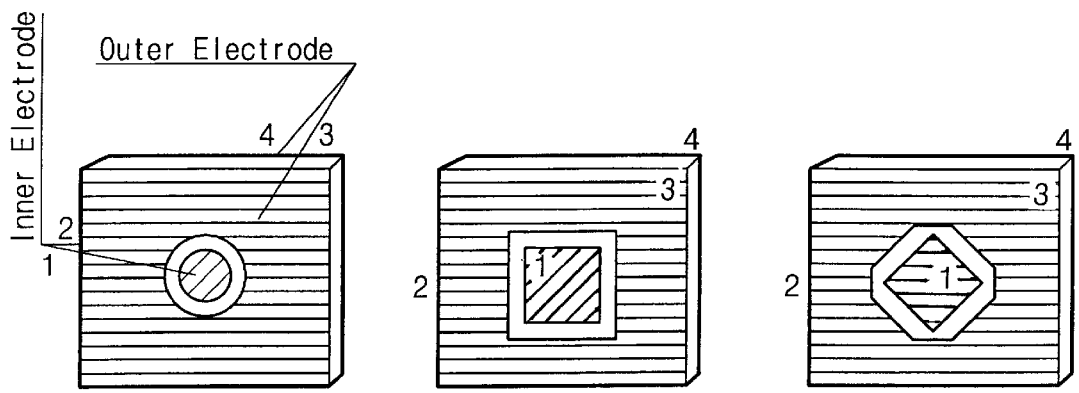
FIG. 1 is perspective view of some embodiments of square piezoceramic transformer plate.
Figure 2:
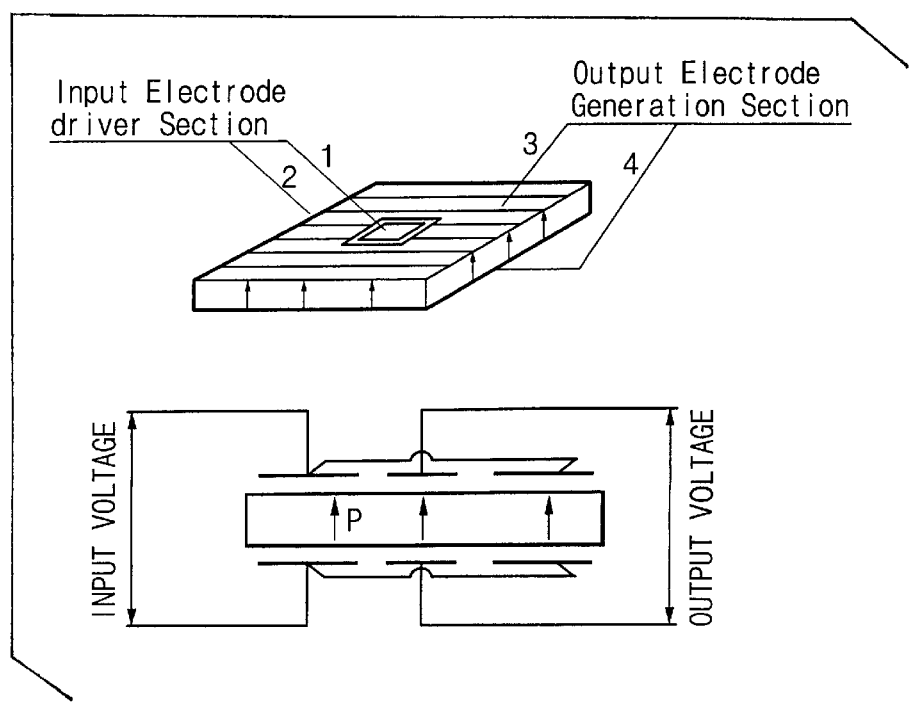
FIG. 2 shows electrode patterns and direction of polarization in a square plate.

The structure of the piezoceramic converter patented is explained further in detail in figures. FIG. 1 shows an example of the constructions of various PCTs. FIG. 2 shows electrode patterns and the direction of polarization of the piezoplate. FIGS. 3, 4, 5, and 6 show the diagrams for the major electric parameters of PCT and piezoceramic generator. FIG. 7 shows the principal electric circuit of a electronic ballast with PCT. In the drawings, DIC indicates control IC; PCT indicates piezoceramic transformer; FET indicates switching FET; C1, D1,D2 and R1 indicate a capacitor, two diodes and a resistor for feedback circuit respectively; and C2 and R2 indicate a capacitor and a resistor for frequency programming respectively.

The gist of this invention is that the piezoplate for PCT is square or circular type that predetermines the most effective electromechanical coupling coefficient, which is known to be maximum when excited at the resonance frequency of square or circular plates. The circuit oscillation of square or circular plates polarized in thickness with symmetric topology of electrodes generally has a monochromatic amplitude characteristic and unambiguous phase characteristic.

Piezoplate thickness is optimized in the range of 1–6 mm depending on the input voltage. The size of square or circular piezoplate, precisely, the side of the square or diameter or circular plates determines the resonance or working frequency of the PCT, the input/output impedance and finally the optimum current loading. The side of the square piezoplate or the diameter of circular piezoplate is 10 to 50 mm.

FIG. 1 shows various examples of PCTs designed in the form of square piezoceramic plate polarized along the thickness. They differ only in the topology of electrodes in the inner and outer sections. The inner excitation section designed with round electrodes is the simplest as compared to the oval square topology of the excitation section that corresponds with a better approximation to unambiguous distribution of elastic stresses of the principal mode of circuit oscillations. The square excitation section has simple topology that does not virtually disturb the distribution of elastic deformations in the principal mode of natural oscillations. If no electric isolation is required between the input and output sections, the input and output electrodes could be connected with each other at one face of the piezoplate.

The distance between the electrodes of the input and output sections is selected in accordance with the requirements of the admissible regulations of electric safety for a use of PCT in the devices of line pulse converters with the input voltage of 100–270 VAC.

The electric circuit on the PCT (see FIG. 2) is quite simple. For example, while electrodes 1 and 2 serve for input, electrodes 3 and 4 serve for output. FIG. 2 shows the direction of the polarization in each section of the piezoplate. The piezoplate is polarized in thickness direction as is shown in FIG. 2.

The piezotransformer operates as follows. Upon inputting the alternate voltage to the electrodes of the input section, the inverse piezoeffect in the bulk of the piezoceramic generates elastic compression-stretching waves, whose amplitude approaches the maximum value at the resonance frequency, i.e. when the frequency of the external electric field coincides with the frequency of the natural mechanical oscillations. For a piezoceramic element designed in the form of a square or circular plate, the principal mode includes the contour extensional oscillation characterized with a high monochromaticity and the highest electromechanical coupling coefficient as compared to the other type of piezo constructions. In turn, the piezoeffect effect in the output section generates voltage of the same frequency.

Figure 3:
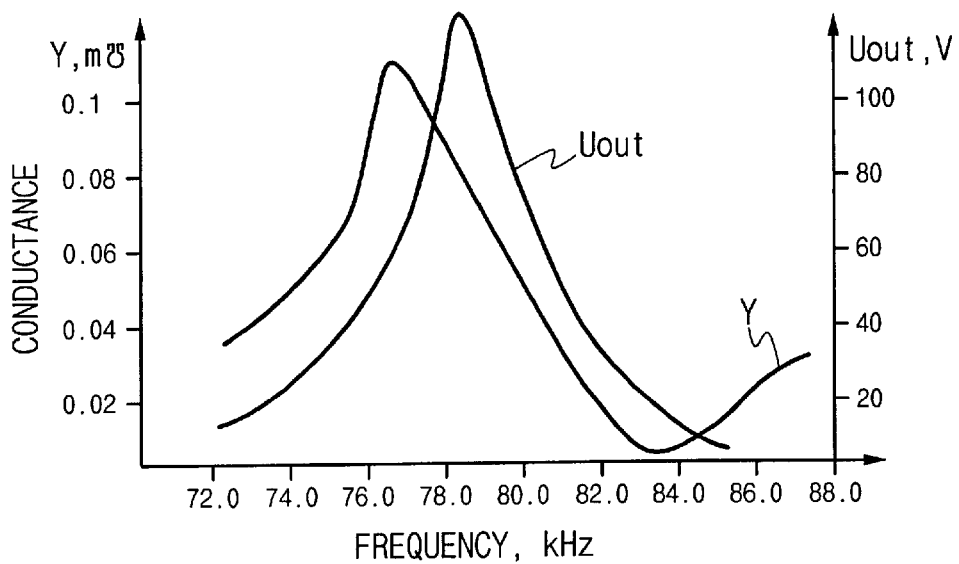
FIG. 3 shows resonance characteristics and output voltage of piezoceramic transformer.

FIG. 3 shows output voltages Uout, and conductance, Y=1/Z, wherein Z is an input impedance of the square piezoceramic transformer, according to the present invention.

It should be noted that piezoelectric transformers show complicated nature of electrical characteristics for frequency variations as shown in FIG. 3. The transformer used was 26×26×5 (mm) with round inner electrodes as input electrodes. Input voltage was 160 Vrms and load resistance was 1.5 kΩ (Kilo Ohm). Frequency at the maximum conductance of the piezoelectric transformer does not coincide with the frequency at the maximum output voltage. Frequency at the maximum frequency corresponds to the mechanical resonance and the frequency at maximum conductance to the electrical resonance of the piezoelectric transformer. Therefore, maximum efficiency is obtained at a frequency located at the right shoulder of output voltage-frequency characteristic curve, i.e., at a frequency higher than the frequency corresponding to a maximum output voltage. When operated at the left shoulder of the curve, input current increases and efficiency decreases about 8–10% compared to the optimum frequency at the right shoulder of the curve. These two resonance frequency change with load impedance and the frequency difference between the two may reach 2–3 kHz. Thus, it is necessary to include a feedback circuit element to set and control frequency at maximum efficiency as explained later.

Figure 4:
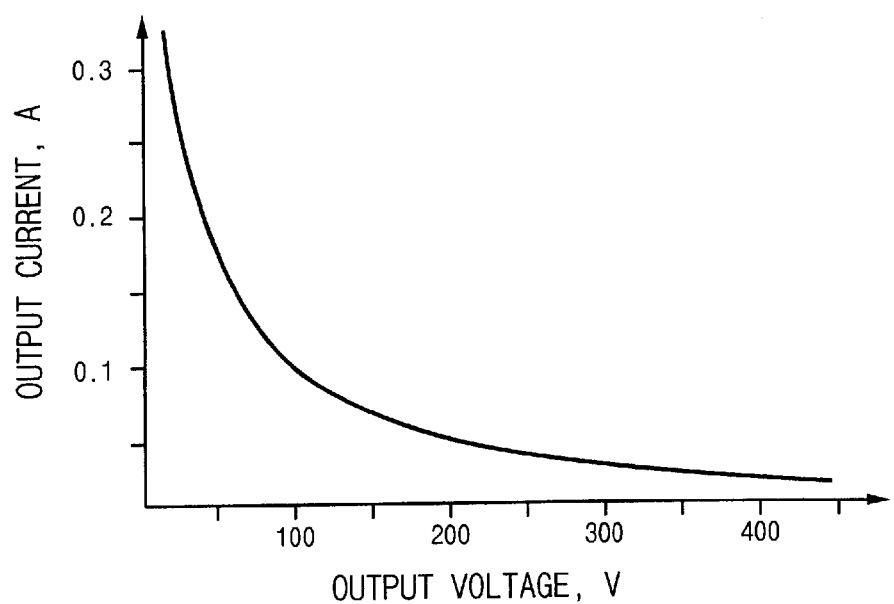
FIG. 4 shows output current as a function of output voltage for the square plate.

FIG. 4 shows the experimental characteristics of the output current versus output voltage for a PCT with a dimension of 26×26×5 mm with an input field intensity of 32 V/mm and a load resistance ranging 50 ohm to 50 KΩ. At an input field intensity of 32 V/mm, i.e., input voltage of 160 Vrms for piezoelectric transformer with thickness of 5 mm, the output current is as large as 0.3 A with the piezoelectric transformer. This current level with the piezoelectric transformer according to the present invention is a couple of order higher than the output current obtained with Rosen type piezoelectric transformer. In addition, the piezoelectric transformer according to the present invention can show step-up or step-down characteristics with varying load resistance. This feature can be used very effectively in ballast circuit for fluorescent lamp as shown in FIG. 7. In contrast to cold cathode fluorescent lamp which requires only step-up feature for ignition or continuous operation after ignition to lamp as shown in the prior art, hot cathode fluorescent lamps used commonly at home or office require step-up characteristic for ignition and step-down characteristic for continuous operation after starting of lamp at the same time. The present invention provides perfect solution for this application with high output current and step-up and down features together.

Figure 5:
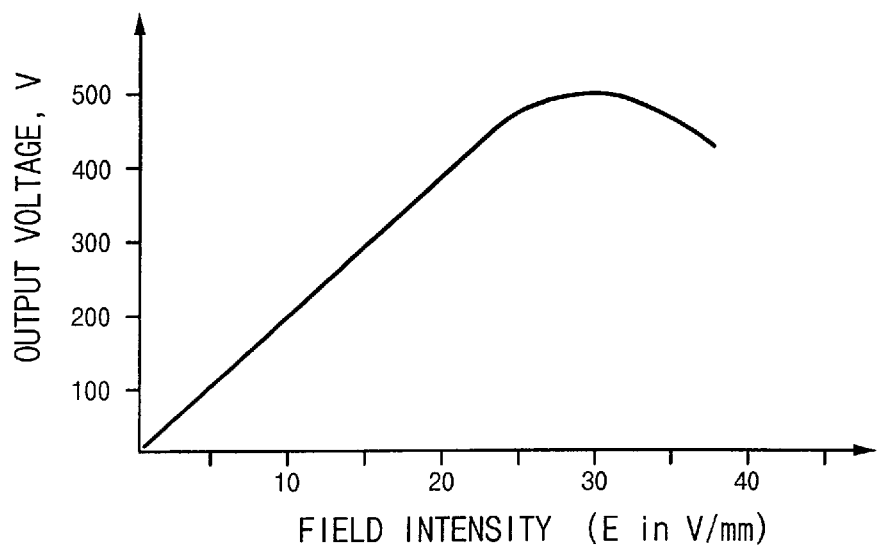
FIG. 5 shows output voltage as a function of field intensity.
Figure 6:
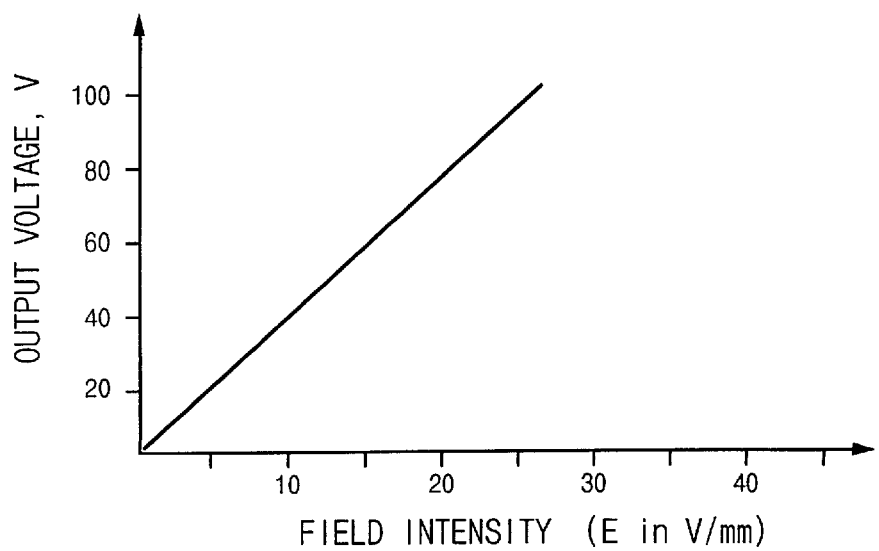
FIG. 6 shows output voltage as a function of field intensity.
Figure 7:
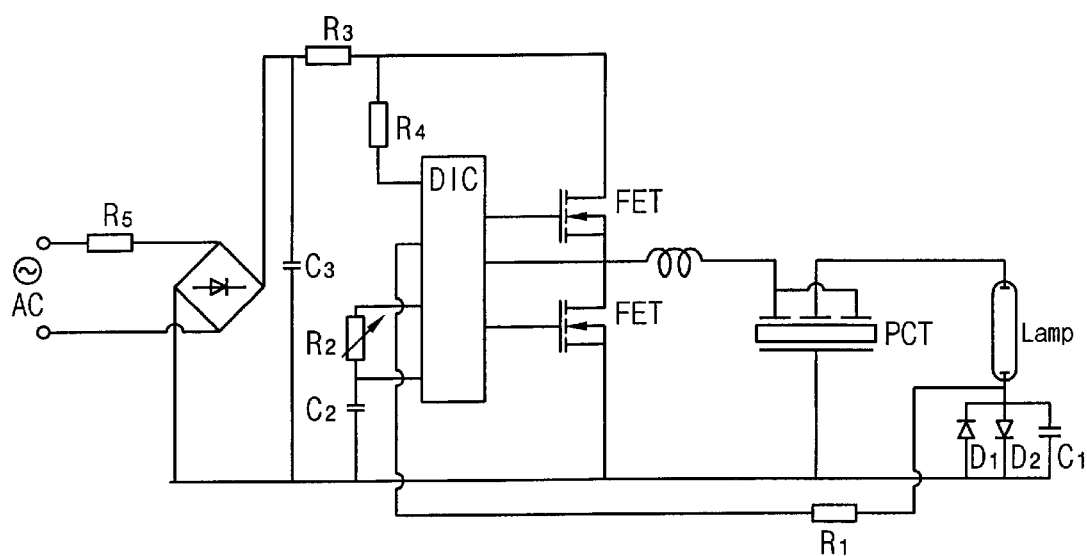
FIG. 7 shows ballast circuit with the piezoceramic transformer.

FIGS. 5 and 6 show the dependence of the output voltage of the PCT on the intensity of the external electric field applied to the electrodes in the input section at the resonance frequency of the PCT for various current loading in the generator (output) section. As shown in FIG. 6, the output voltage is not saturated up even at a high electrical field up to 25 V/mm, i.e., input voltage of 125 Vrms with a reasonable load resistance. Piezoelectric transformer of 5 mm in thickness can be fed 220 Vrms without deterioration of the electrical characteristics. Without any load, its step-up ratio is very big and output voltage saturates very fast and if high voltage is applied, the transformer breaks immediately due to large amplitude of vibration.

Analysis of the self-excitation converters with PCTs includes a determination of the conditions for commencement and establishment of the stationary amplitude of oscillations with respect to changes in various factors: supply voltage, load current, ambient temperature, air humidity, etc.

FIG. 7 shows the principal electric scheme of the electronic ballast for luminescent lamps based on piezoceramic converter with a piezoelectric transformer designed in the form of a square or circular piezoplate. A self-excitation converter version represented in FIG. 7 includes two switching FETs(FET), a driving circuit(DIC) and a positive feedback circuit made of two diodes, a condenser, a resistor and a load. The converter includes a control IC(DIC) synchronized with the output voltage of the PCT, enabling to control the working regime of the piezoplate at the frequency of its mechanical resonance independently of the load current. At the input of the converter, the bridge rectifier is installed for the line alternate voltage. The rectified oscillating voltage comes to the smoothing capacitor C3 as a filter. Resistors R3 and R5 serve for limiting the current surges in overloads.

The pulse generator is designed on the basis of the economic integrated MOS circuit. The microcircuit working voltage is determined by resistor R4. The frequency-programming elements R2, C2 of the generator microcircuit provide the generator operation within the working resonance region of the PCT frequency. The output voltage from the generator section of the PCT comes to the load (the luminescent lamp electrodes) and through the section made of two diodes, one condenser and one resistor to the frequency-programming input of the generator microcircuit. At the initial moment of switching-on of a fluorescent lamp when its resistance is sufficiently high in the range of MΩ before ignition, the output voltage is generated as high as 500 V or higher. In the working resonance frequency of 60 kHz to 70 kHz, these conditions are sufficient for a forced ionization of the luminescent lamp and a sharp increase of the current therein. Because the current increase is limited by the internal resistance of the PCT, the lamp current is stabilized. Meanwhile, the resonance frequency of the PCT is reset, the output voltage decreases to the certain value providing the required luminous flux.

What is claimed is:

1. A piezoceramic converter comprising a piezoceramic transformer, wherein the transformer includes square-shaped inner electrodes and outer electrodes interchangeably used for input/output electrodes, which are formed on both opposite surfaces of a square piezoplate, the inner electrodes are respectively separated from the outer electrodes by a gap of 0.3 to 3.0 mm, the piezoplate is polarized in thickness direction and excited in contour extension mode, and a side of the square is 10–50 mm and thickness of the transformer is 1–6 mm.

2. A piezoceramic converter as claimed in claim 1, wherein the area of the inner electrodes is 10–80% of the area of a surface of the piezoplate.

3. A piezoceramic converter as claimed in claim 1, wherein the electrode pattern with a gap is identical in the both surfaces.

4. A piezoceramic converter as claimed in claim 1, wherein the inner electrode is covered by an additional dielectric layer with an electrode applied to the surface, whose size and configuration is identical to those of the inner electrode.

5. A piezoceramic converter comprising a piezoceramic transformer, wherein the transformer includes circular-shaped inner electrodes and outer electrodes interchangeably used for input/output electrodes, which are formed on both opposite surfaces of a square piezoplate, the inner electrodes are respectively separated from the outer electrodes by a gap of 0.3 to 3.0 mm, the piezoplate is polarized in thickness direction and excited in contour extension mode, and a side of the square is 10–50 mm and thickness of the transformer is 1–6 mm.

6. A piezoceramic converter as claimed in claim 5, wherein the area of the inner electrodes is 10–80% of the area of a surface of the piezoplate.

7. A piezoceramic converter as claimed in claim 5, wherein the electrode pattern with a gap is identical in the both surfaces.

8. A piezoceramic converter as claimed in claim 5, wherein the inner electrode is covered by an additional dielectric layer with an electrode applied to the surface, whose size and configuration is identical to those of the inner electrode.

9. A piezoceramic converter comprising a piezoceramic transformer, wherein the transformer is in a shape of a square plate having two surfaces, of which one of both surfaces includes a square-shaped inner electrode formed in the middle of the plate and an outer electrode with a gap covering a remainder of the surface interchangeably used for input/output electrodes respectively and the other opposite surface is covered completely with an electrode used for a common electrode for the input/output electrodes, the piezoplate is polarized in the thickness direction and excited in contour extension mode, and a side of the square is 10–50 mm and thickness of the transformer is 1–6 mm.

10. A piezoceramic converter comprising a piezoceramic transformer, wherein the transformer is in a shape of a square plate having two surfaces, of which one of both surfaces includes a circular-shaped inner electrode formed in the middle of the plate and an outer electrode with a gap covering a remainder of the surface interchangeably used for input/output electrodes respectively and the other opposite surface is covered completely with an electrode used for a common electrode for the input/output electrodes, the piezoplate is polarized in the thickness direction and excited in contour extension mode, and a side of the square is 10–50 mm and thickness of the transformer is 1–6 mm.

* * * * *